(12) United States Patent  (10) Patent No.: US 6,693,305 B2
Otsuka et al.  (45) Date of Patent: Feb. 17, 2004

(54) SEMICONDUCTOR DEVICE FORMED BY CASCADE-CONNECTING A PLURALITY OF DIODES (75) Inventors: Nobuaki Otsuka, Komae (JP); Tomoaki Yabe, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 09/998,753

(22) Filed: Dec. 3, 2001

(65) Prior Publication Data

US 2002/0093022 A1 Jul. 18, 2002

(30) Foreign Application Priority Data

Jan. 18, 2001 (JP) .......................................... 2001-010243

(51) Int. Cl.[7] .............................................. H01L 29/161
(52) U.S. Cl. .......................... 257/84; 257/339; 257/335; 257/362; 257/601
(58) Field of Search ........................... 257/84, 339, 355, 257/358, 362, 363, 601

(56) References Cited

U.S. PATENT DOCUMENTS

| 4,037,140 | A | * | 7/1977 | Eaton, Jr. | 361/56 |
|---|---|---|---|---|---|
| 5,550,699 | A | * | 8/1996 | Diaz | 361/56 |
| 5,585,752 | A | * | 12/1996 | Botti et al. | 327/131 |
| 5,654,862 | A | * | 8/1997 | Worley et al. | 361/111 |
| 5,696,398 | A | * | 12/1997 | Yamamoto | 257/362 |
| 5,714,900 | A | * | 2/1998 | Ehlers | 327/325 |
| 5,994,760 | A | * | 11/1999 | Duclos | 257/546 |
| 6,229,180 | B1 | * | 5/2001 | Yoshida et al. | 257/355 |
| 6,271,692 | B1 | * | 8/2001 | Iihoshi et al. | 327/81 |
| 6,292,343 | B1 | * | 9/2001 | Pequignot et al. | 361/111 |
| 6,430,016 | B1 | * | 8/2002 | Marr | 361/56 |
| 6,486,515 | B2 | * | 11/2002 | Jun et al. | 257/360 |
| 6,537,868 | B1 | * | 3/2003 | Yu | 438/237 |
| 2001/0023962 | A1 | * | 9/2001 | Pasqualini | 257/355 |
| 2001/0042887 | A1 | * | 11/2001 | Lee et al. | 257/355 |
| 2002/0005526 | A1 | * | 1/2002 | Czech et al. | 257/173 |
| 2002/0018328 | A1 | * | 2/2002 | Nakamura et al. | 361/91.5 |

FOREIGN PATENT DOCUMENTS

| JP | 61-24251 | * | 2/1986 |
|---|---|---|---|
| JP | 61-225908 | * | 10/1986 |
| JP | 62-159457 | * | 7/1987 |
| JP | 4-303959 | * | 4/1992 |
| JP | 4-324674 | | 11/1992 |
| JP | 7-221269 | * | 8/1995 |
| JP | 9-64379 | * | 3/1997 |
| JP | 11-284175 | * | 10/1999 |
| JP | 11-317532 | * | 11/1999 |
| JP | 20001-103731 | * | 4/2001 |

* cited by examiner

Primary Examiner—Nathan J. Flynn
Assistant Examiner—Ahmed N. Sefer
(74) Attorney, Agent, or Firm—Banner & Witcoff, Ltd.

(57) ABSTRACT

A semiconductor device includes a plurality of diodes including a substrate of a first conductivity type biased to a reference potential, a well region of a second conductivity type formed in a surface region of the substrate, and a first diffusion region of the first conductivity type formed in a surface region of the well region, wherein the plurality of diodes have sizes of at least two kinds and are cascade-connected to each other.

15 Claims, 5 Drawing Sheets

SEMICONDUCTOR DEVICE FORMED BY CASCADE-CONNECTING A PLURALITY OF DIODES

CROSS-REFERENCE TO RELATED APPLICATIONS

This application is based upon and claims the benefit of priority from the prior Japanese Patent Application No. 2001-010243, filed Jan. 18, 2001, the entire contents of which are incorporated herein by reference.

BACKGROUND OF THE INVENTION

1. Field of the Invention

The present invention relates to a semiconductor device formed by cascade-connecting a plurality of diodes, particularly, to an ESD (Electro-Static Discharge) protective circuit of a semiconductor element.

2. Description of the Related Art

In a conventional semiconductor device formed by the CMOS (Complementary Metal Oxide Semiconductor) process, an electrostatic discharge protective circuit (hereinafter referred to as an "ESD protective circuit") is arranged in general between the semiconductor element and input-output pins. In general, the ESD protective circuit is formed by cascade-connecting a plurality of diodes.

Figure 4A:
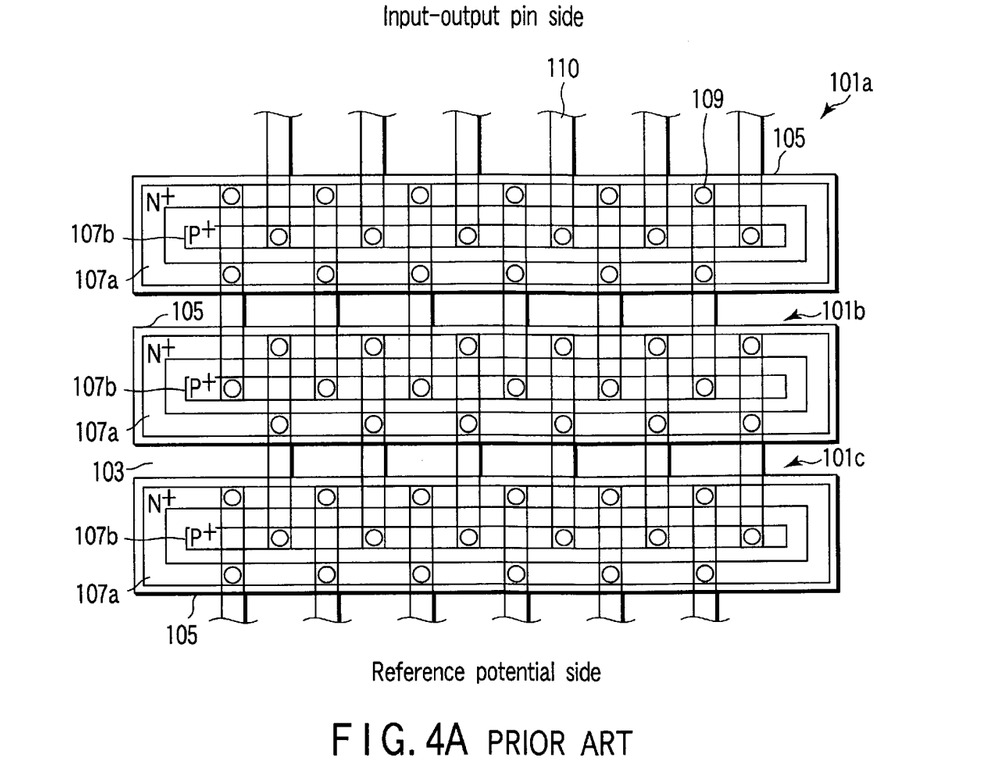
FIGS. 4A and 4B schematically show collectively the construction of the ESD protective circuit for describing the problem inherent in the prior art.
Figure 4B:
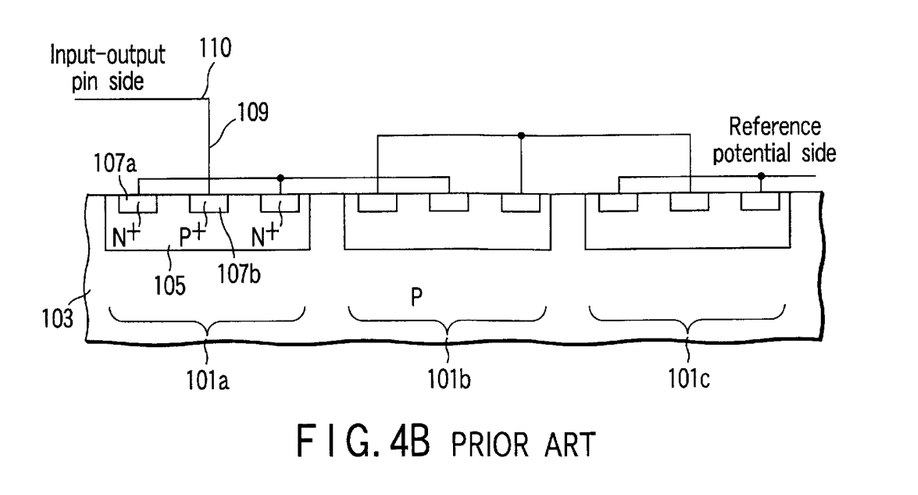

FIGS. 4A and 4B collectively show a conventional ESD protective circuit; wherein FIG. 4A is a plan view showing the layout of the ESD protective circuit, and FIG. 4B is a cross sectional view showing the construction of the ESD protective circuit. In this example, the ESD protective circuit comprises three diodes 101a, 101b and 101c.

In the conventional ESD protective circuit, the three diodes 101a, 101b, 101c are substantially equal to each other in size. Also, these diodes 101a, 101b, 101c are laid out in the same direction. In the particular construction, each of the diodes 101a, 101b, 101c, are formed by the standard CMOS process. For example, three N-type well regions 105 are formed in substantially the same size in a surface region of a P-type semiconductor substrate 103. Also, an N$^+$-type diffusion layer 107a and a P$^+$-type diffusion layer 107b are formed in a surface region of each of the N-type well regions 105. In the particular construction, each of the diodes 101a, 101b, and 101c, forms a parasitic bipolar structure including the P-type semiconductor substrate 103.

It should be noted that, among the three diodes 101a, 101b, and 101c, the N$^+$-type diffusion layers 107a in a certain diode are connected to the P$^+$-type diffusion layer 107b of the adjacent diode by a metal wiring 110 via contacts 109. As a result, the three diodes 101a, 101b, and 101c, are cascade-connected to each other. The construction described above with reference to FIGS. 4A and 4B is widely employed in the prior art.

Figure 5:
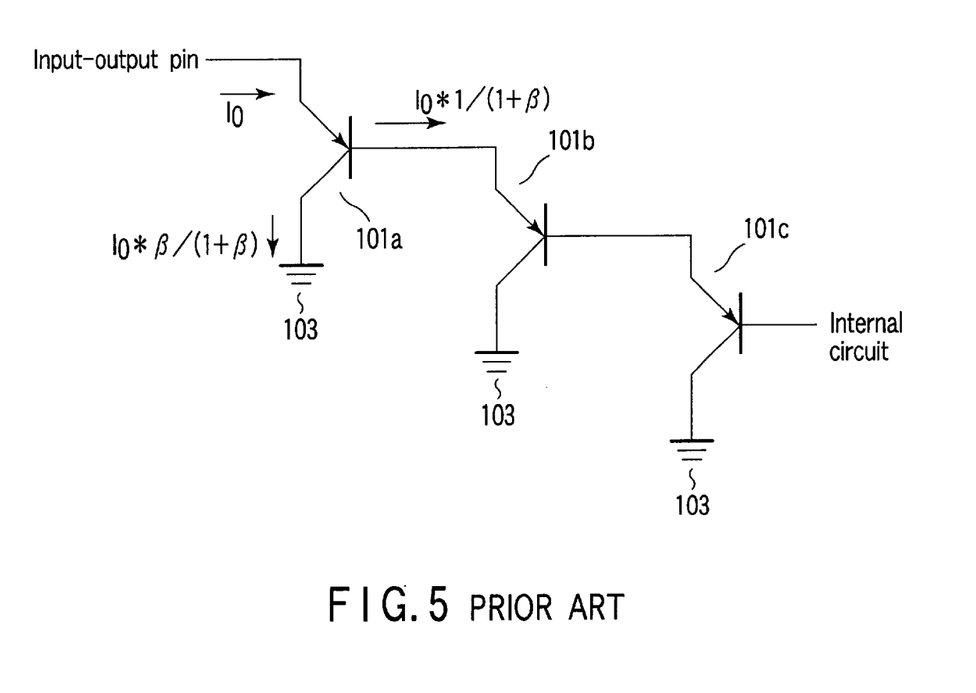
FIG. 5 is an equivalent circuit diagram of the conventional ESD protective circuit.

FIG. 5 shows an equivalent circuit diagram of the ESD protective circuit of the construction described above. If, for example, current $I_0$ flows in the forward direction through the diode 101a in the case of the ESD protective circuit described above, a current $I_0 1*/(1+\beta)$ flows as a base current into the latter stage diode 101b. Also, there is a current $I_0*\beta/(1+\beta)$ flowing into the P-type semiconductor substrate 103 as the collector current (substrate current) in addition to the base current noted above.

To be more specific, if an electrostatic discharge voltage (ESD voltage) is applied to the input-output pin (not shown), the current flows through the diodes 101a, 101b, 101c in the order mentioned. In this case, a part of the current $I_0$ flowing into the first stage diode 101a connected to the input-output pin is lost as a substrate current $I_0*\beta/(1+\beta)$. As a result, the current (base current) $I_0*1/(1+\beta)$, which is decreased from the current $I_0$ by the substrate current $I_0*\beta/(1+\beta)$, flows into the second stage diode 101b. Likewise, the current partly flows into the P-type semiconductor substrate 103 in each of the second stage diode 101b and third stage diode 101c. It follows that the current flowing into the diodes 101b and 101c is gradually decreased.

It should be noted that, in the conventional ESD protective circuit, all the diodes 101a, 101b, and 101c, are equal to each other in size. As a result, these diodes 101a, 101b, and 101c, have the same current capacity. It follows that, since the current is gradually decreased as described above, each of the latter stage diodes 101b, and 101c, has an unnecessary current capacity.

There is no problem in the case where the area occupied by the ESD protective circuit in the chip does not affect the chip size. However, the scaling in the element of the semiconductor device proceeds year by year, with the result that the area of the peripheral circuit including the internal circuit is being made smaller and smaller. On the other hand, the scaling of the ESD protective circuit is not performed in view of the necessity for ensuring a sufficient current capacity, with the result that the area occupied by the ESD protective circuit in the chip is relatively increased. It follows that a serious problem is brought about that the area of the ESD protective circuit affects the chip size. In short, formation of the diodes 101b, 101c, each sized to have an unnecessary current capacity leads to loss of the area.

Suppose that the diodes 101a, 101b, 101c, of the different stages have the same size, and that the same current flows though these diodes 101a, 101b, and 101c.

In this case, these diodes 101a, 101b, and 101c, are rendered equal to each other in the voltage drop Vf in the forward direction. However, these diodes 101a, 101b, 101c, differ from each other in the current flowing therethrough, as pointed out above. Naturally, these diodes 101a, 101b, 101c, are not equal to each other in the voltage drop Vf. It follows that it is difficult to design the circuit that withstands a high voltage conforming with the sum of the amounts of the voltage drop in respect of the protective capacity.

As described above, the conventional ESD protective circuit is formed of a parasitic bipolar structure manufactured by a CMOS process. However, the conventional ESD protective circuit has the problems that the layout area of the ESD protective circuit occupied in the chip size cannot be decreased, and that it is difficult to achieve the withstand voltage.

BRIEF SUMMARY OF THE INVENTION

According to a first aspect of the present invention, there is provided a semiconductor device, comprising:

a plurality of diodes including a substrate of a first conductivity type biased to a reference potential, a well region of a second conductivity type formed in a surface region of the substrate, and a first diffusion region of the first conductivity type formed in a surface region of the well region;

wherein the plurality of diodes have sizes of at least two kinds and are cascade-connected to each other.

DETAILED DESCRIPTION OF THE INVENTION

Embodiments of the present invention will now be described in further detail with reference to the accompanying drawings.

(First Embodiment)

Figure 1:
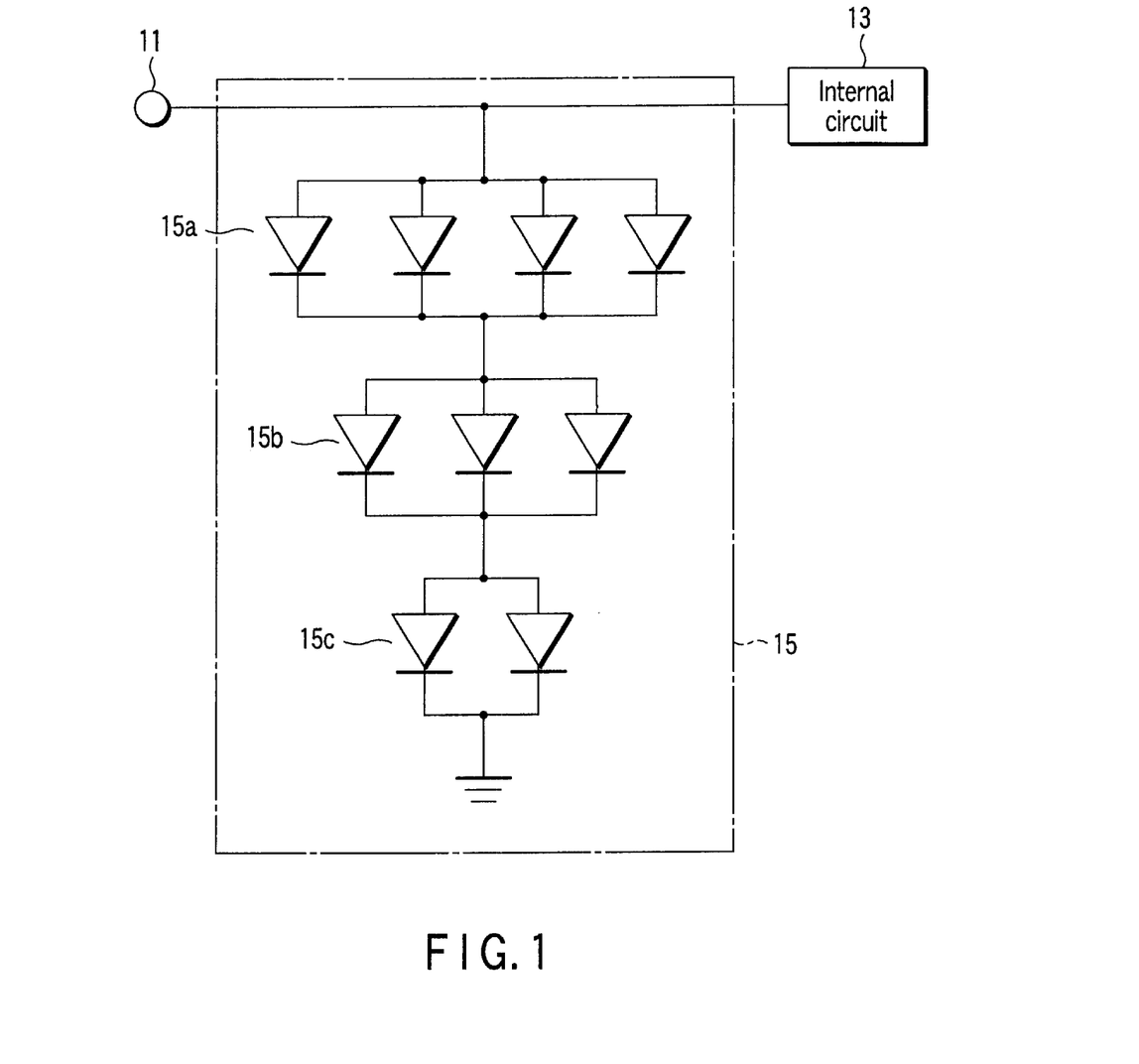
FIG. 1 exemplifies the construction of a semiconductor device according to a first embodiment of the present invention.

FIG. 1 exemplifies the construction of a semiconductor device according to a first embodiment of the present invention. In this embodiment, an ESD protective circuit is formed of three diodes.

Specifically, in the semiconductor device shown in FIG. 1, an ESD protective circuit 15 is arranged between an input-output pin (or input pin) 11 formed on a chip and acting as an input terminal of an external signal and an internal circuit 13 forming a semiconductor element. The ESD protective circuit 15 is formed by a standard CMOS process.

Figure 2:
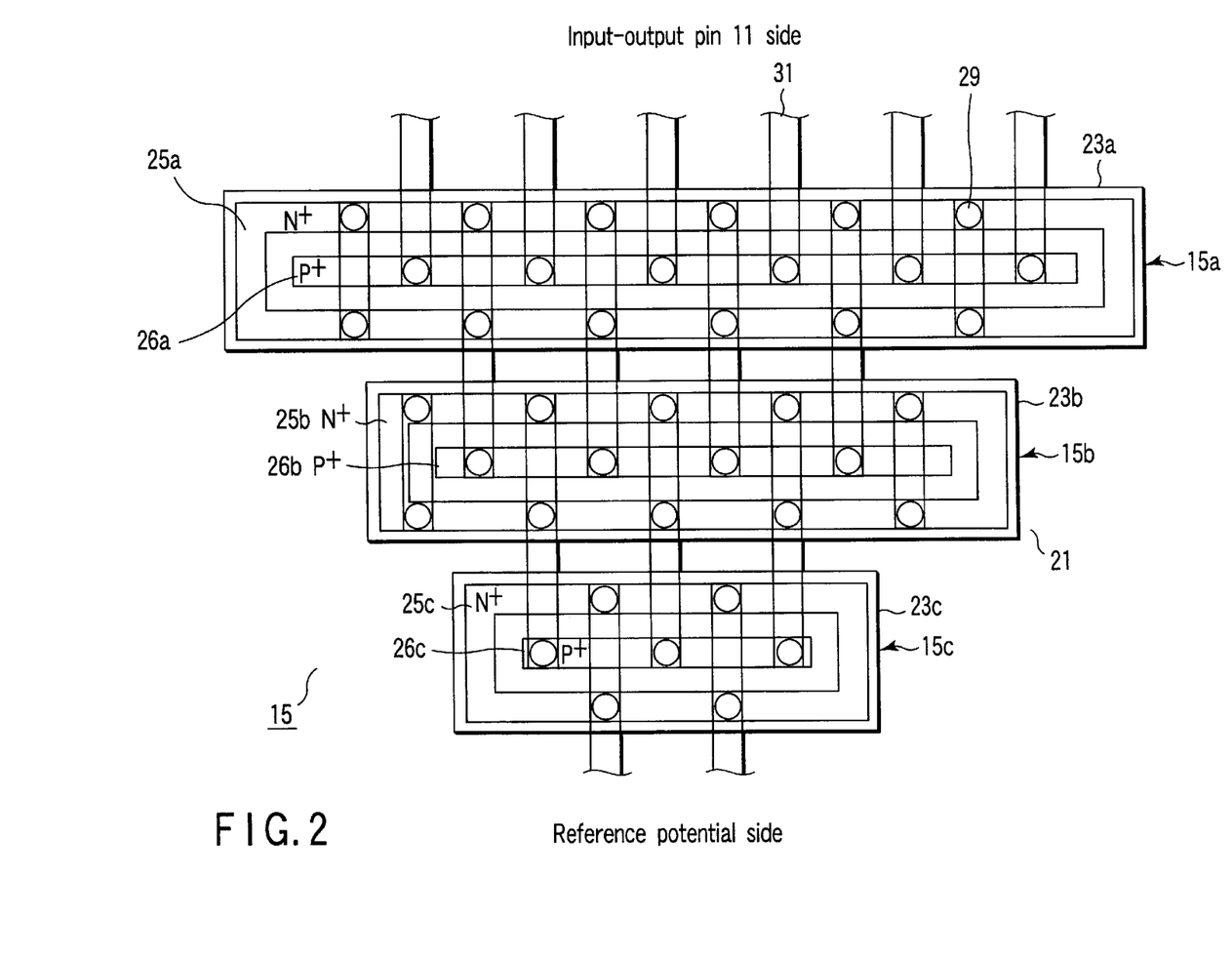
FIG. 2 is a plan view exemplifying the layout of the ESD protective circuit included in the semiconductor device shown in FIG. 1.

FIG. 2 exemplifies the layout of the ESD protective circuit 15. As shown in the drawing, a P-type semiconductor substrate (substrate of a first conductivity type) 21 is biased to the reference potential. N-type well regions (well regions of a second conductivity type) 23a, 23b, 23c are laid out in the same direction in a surface region of the P-type semiconductor substrate 21. An $N^+$-type diffusion region (second diffusion region of the second conductivity type) 25a and a $P^+$-type diffusion region (first diffusion region of the first conductivity type) 26a are formed in a surface region of the N-type well region 23a. Likewise, an $N^+$-type diffusion region 25b and a $P^+$-type diffusion region 26b are formed in a surface region of the N-type well region 23b. Further, an $N^+$-type diffusion region 25c and a $P^+$-type diffusion region 26c are formed in a surface region of the N-type well region 23c. As a result, formed are diodes 15a, 15b, 15c of the parasitic bipolar structure.

These diodes 15a, 15b and 15c are cascade-connected to each other by metal wirings 31 via contacts 29. Also, one end of the ESD protective circuit 15 (on the side of the connecting edge to the input-output pin) is connected to the input-output pin 11, and the other end (on the side of the reference potential edge) is connected to the reference potential.

It should be noted that the diodes 15a, 15b, 15c differ from each other in size. In the case of this embodiment, the $P^+$-type diffusion layers 26a to 26c are formed to have three kinds of different sizes defined by the area or the peripheral length. As a result, it is possible to form the diodes 15a, 15b, 15c such that the sizes of these diodes are gradually diminished from the side of the input-output pin 11 toward the reference potential side, i.e., 15a>15b>15c.

The semiconductor device is designed such that the parasitic bipolar effect permits the ratio in the size of the diodes 15a, 15b, 15c to be rendered substantially equal to the ratio of the current flowing out of the base to the current flowing into the emitter. In other words, the ratio in the size of the diodes 15a, 15b, 15c is set substantially equal to the ratio of the output current to the input current excluding the loss caused by the collector current (substrate current) flowing into the P-type semiconductor substrate 21.

The $P^+$-type diffusion region 26a of the first stage diode 15a is connected to the input-output pin 11 by the metal wirings 31 through the contacts 29. The $N^+$-type diffusion region 25a of the first stage diode 15a is connected to the $P^+$-type diffusion region 26b of the second stage diode 15b by the metal wirings 31 through the contacts 29. The $N^+$-type diffusion region 25b of the second stage diode 15b is connected to the $P^+$-type diffusion region 26c of the third stage diode 15c by the metal wirings 31 through the contacts 29. Further, the $N^+$-type diffusion region 25c of the third stage diode 15c is connected to the reference potential by the metal wirings 31 through the contacts 29.

As described above, in the ESD protective circuit 15 according to the first embodiment of the present invention, the diode 15a connected directly to the input-output pin 11 is formed to have a size larger than that of each of the other diodes 15b and 15c. Also, the diodes 15a, 15b, 15c of the first, second and third stages, respectively, are formed to be equal to each other in the relative ratio of the current flowing therethrough to the size. As a result, it is possible to make these diodes 15a, 15b, 15c equal to each other in the voltage drop in the forward direction. Of course, the ratio of the current described previously differs depending on the current flowing into the diode. It follows that it is impossible to make the ratio of the current equal to the ratio of the size unconditionally. Such being the situation, let us suppose the case where a high voltage that must not be applied in view of the withstand voltage of the internal circuit 13, which is to be protected by the ESD protective circuit 15, is applied to the input-output pin 11. Then, the size of each of these diodes is determined to conform with the current flowing into each of the diodes 15a, 15b, 15c. As a result, the diodes 15a, 15b, 15c can be made substantially equal to each other in the voltage drop. It follows that it is possible to design the withstand voltage in proportion to the number of stages of the diodes so as to facilitate the design of the withstand voltage of the ESD protective circuit 15.

The amount of current that is allowed to flow into the second stage diode 15b is determined by the size of the first stage diode 15a. Also, the amount of current that is allowed to flow into the third stage diode 15c is determined by the size of the second stage diode 15b. In other words, it suffices for the second stage diode 15b to have a size (current capacity) large enough to allow the current flowing out of the first stage diode 15a, from which the substrate current is subtracted, to flow through the second stage diode 15b. Likewise, it suffices for the third stage diode 15c to have a size (current capacity) large enough to allow the current flowing out of the second stage diode 15b, from which the substrate current is subtracted, to flow through the third stage diode 15c. It follows that the current capacities of the diodes 15b, 15c, which are decreased by the gradual decrease in the sizes of the diodes 15a, 15b, 15c, are replenished by the substrate current. As a result, the current capacity as the ESD protective circuit 15 is substantially equal to that in the prior art.

In addition, the sizes of the second stage diode 15b and the third stage diode 15c can be successively decreased. As a result, it is possible to decrease the area of the ESD protective circuit 15, which is equal to the sum of the areas of the diodes 15a, 15b and 15c. In this case, the rate of the current decreased by the substrate current in each of the diodes 15a, 15b, 15c is as follows. Suppose the ratio of the output current to the input current of the diode is α, and the required size of the first stage diode 15a is W0. In this case, the required size of the second stage diode 15b is W0·α, and the required size of the third stage diode 15c is W0·α². For example, where the ratio α of the output current to the input current is 0.5, and the number of stages of the diodes is 5, the diodes as a whole required the size of 5·W0 in the prior art. In the first embodiment of the present invention, however, the required size of the diodes as a whole is 1.938·W0, which is less than half the value in the prior art.

Where the layout area of the ESD protective circuit comes to affect the chip size with progress in the scaling of the semiconductor element, the decrease in the layout area of the ESD protective circuit 15 leads to miniaturization of the chip size, so as to achieve the cost saving.

(Second Embodiment)

Figure 3:
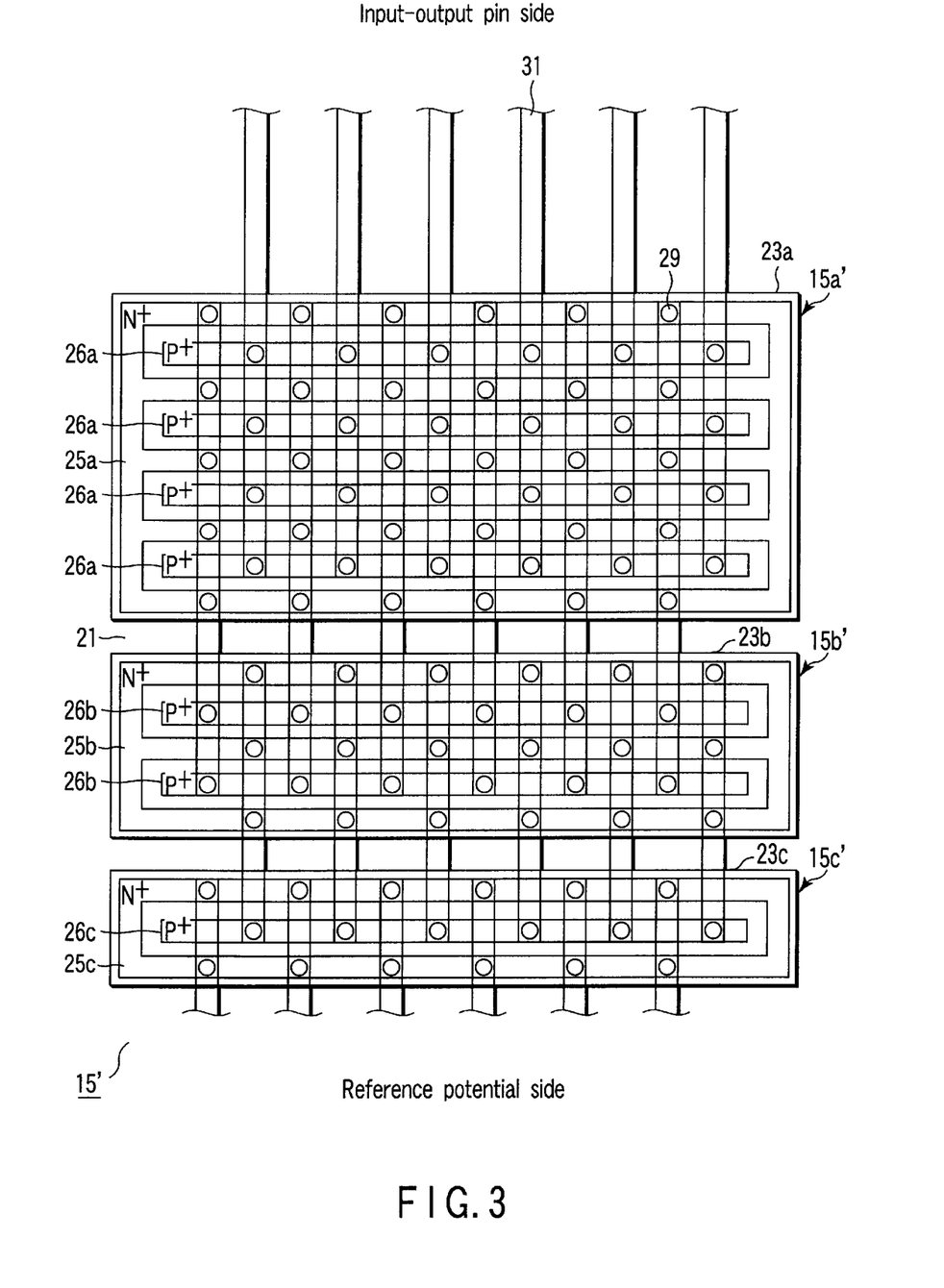
FIG. 3 is a plan view exemplifying the layout of the ESD protective circuit according to a second embodiment of the present invention.

FIG. 3 exemplifies the layout of an ESD protective circuit 15' according to a second embodiment of the present invention. In this embodiment, an ESD protective circuit 151 is formed of three diodes.

The ESD protective circuit 15' according to the second embodiment of the present invention is formed by, for example, a standard CMOS process. Specifically, the P-type semiconductor substrate (substrate of the first conductivity type) 21 is biased to the reference potential. N-type well regions (well regions of the second conductivity type) 23a, 23b, 23c are laid out in the same direction in a surface region of the P-type semiconductor substrate 21. An N⁺-type diffusion region (second diffusion region of the second conductivity type) 25a and P⁺-type diffusion regions (first diffusion regions of the first conductivity type) 26a are formed in a surface region of the N-type well region 23a. Likewise, an N⁺-type diffusion region 25b and P⁺-type diffusion regions 26b are formed in a surface region of the N-type well region 23b. Further, an N⁺-type diffusion region 25c and a P⁺-type diffusion region 26c are formed in a surface region of the N-type well region 23c. As a result, formed are a first stage diode 15a', a second stage diode 15b' and a third stage diode 15c' of the parasitic bipolar structure.

These diodes 15a', 15b' and 15c' are formed in sizes differing from each other. For example, the sizes of the first stage diode 15a', the second stage diode 15b' and the third stage diodes 15c' are gradually decreased from the first stage diode 15a' positioned on the side of the input-output pin toward the third stage diode 15c' positioned on the side of the reference potential (15a'>15b'>15c').

In the case of the second embodiment, the diode 15c', which is formed of the diffusion region 26c having a predetermined area or peripheral length, forms a unit, and each of the diodes 15a' and 15b' is formed to have a size a plurality of times as large as the size of the diode 15c'. As a result, each of the diodes 15a' and 15b' is formed to have a predetermined size. In other words, the first stage diode 15a', the second stage diode 15b', and the third stage diode 15c' are allowed to be different from each other in the number of diodes 15c' included therein. For example, the first stage diode 15a' has a size equal to the sum of four diodes 15c'. On the other hand, the second stage diode 15b' has a size equal to the sum of two diodes 15c'. In this fashion, the first stage diode 15a', the second stage diode 15b' and the third stage diode 15c' are formed to be different from each other in size. It should be noted that the parasitic bipolar effect permits the ratio in the size of the diodes 15a', 15b40, 15c' to be rendered substantially equal to the ratio of the output current to the input current excluding the loss caused by the collector current (substrate current) flowing into the P-type semiconductor substrate 21 in the second embodiment, too.

As in the first embodiment described previously, one edge of the ESD protective circuit 15' (connecting edge side to the input-output pin) in the second embodiment is connected to the input-output pin used as an input terminal of an external signal, and the other edge (reference potential edge side) is connected to the reference potential. The first stage diode 15a', the second stage diode 15b' and the third stage diode 15c' are cascade-connected to each other by the metal wirings 31 through the contacts 29. For example, the P⁺-type diffusion region 26a of the first stage diode 15a' is connected to the input-output pin by the wrings 31 through the contacts 29. The N⁺-type diffusion region 25a of the first stage diode 15a' is connected to the P⁺-type diffusion region 26b of the second stage diode 15b' by the metal wirings 31 through the contacts 29. The N⁺-type diffusion region 25b of the second stage diode 15b' is connected to the P⁺-type diffusion region 26c of the third stage diode 15c' by the metal wirings 31 through the contacts 29. Further, the N⁺-type diffusion region 25c of the third stage diode 15c' is connected to the reference potential by the metal wirings 31 through the contacts 29.

The ESD protective circuit 15' according to the second embodiment of the present invention, which is constructed as described above, also permits producing the effects similar to the effects produced by the ESD protective circuit 15 according to the first embodiment of the present invention. To be more specific, the first stage diode 15a', the second stage diode 15b' and the third stage diode 15c' can be made substantially equal to each other in the voltage drop in the forward direction without changing the current capacity as the ESD protective circuit 15'. As a result, the withstand voltage can be designed in proportion to the number of stages of the diodes so as to facilitate the design of the withstand voltage.

It should also be noted that the sizes of the first stage diode 15a', the second stage diode 15b' and the third stage diode 15c' can be successively decreased. It follows that, even where the scaling of the semiconductor element proceeds so as to have the chip size affected by the layout area of the ESD protective circuit, the reduction in the layout area of the ESD protective circuit 15' achieved in the second embodiment makes it possible to miniaturize the chip size and to decrease the manufacturing cost.

As described above, in the present invention, a plurality of stages of the diodes, which are cascade-connected to each other, can be made substantially equal to each other in the voltage drop in each stage. Also, the diode in each stage is formed to have a required size in terms of the current capacity. To be more specific, where an ESD protective circuit for protecting the internal circuit from the electrostatic discharge is formed by cascade-connecting a plurality of diodes and by withdrawing the current in the forward direction in a semiconductor device manufactured by the CMOS process, the plural cascade-connected diodes are made different from each other in size. In this case, the sizes of the diodes are gradually reduced from the diode positioned on the side of the connection edge to the input-output pin toward the diode positioned on the side of the reference potential. As a result, the diodes in the different stages can be easily made substantially equal to each other in the voltage drop in the forward direction, thereby improving the difficulty in the design of the withstand voltage. In addition, the layout area can be reduced without impairing the current capacity as the ESD protective circuit. It follows that it is possible to prevent the layout area of the ESD protective circuit from affecting the chip size.

In each of the first and second embodiments of the present invention described above, the ESD protective circuit is formed of three diodes. However, the present invention is not limited to the particular construction. Of course, it is possible for the ESD protective circuit to be formed of, for example, four or more diodes.

Also, the present invention is not limited to the case where the diode for each stage is formed of a single diode. For example, it is possible to connect a plurality of diodes in parallel for forming the diode for each stage.

Further, it is possible to arrange a single ESD protective circuit for a single input-output pin (including an input pin). Alternatively, it is also possible to arrange a single ESD protective circuit for a plurality of input-output pins.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device, comprising:
   a plurality of diodes including a substrate of a first conductivity type biased to a reference potential, a well region of a second conductivity type formed in a surface region of said substrate, and a first diffusion region of the first conductivity type formed in a surface region of said well region;
   wherein said plurality of diodes has sizes of at least two kinds and are cascade-connected to each other,
   wherein the size of each of said plurality of diodes is defined by said first diffusion region.

2. The semiconductor device according to claim 1, wherein the size of each of said plurality of diodes is defined by the peripheral length of said first diffusion region.

3. The semiconductor device according to claim 1, wherein the size of each of said plurality of diodes is defined by the area of said first diffusion region.

4. A semiconductor device, comprising:
   a plurality of diodes including a substrate of a first conductivity type biased to a reference potential, a well region of a second conductivity type formed in a surface region of said substrate, and a first diffusion region of the first conductivity type formed in a surface region of said well region;
   wherein said plurality of diodes has sizes of at least two kinds and are cascade-connected to each other,
   wherein each of said plurality of diodes further comprises a second diffusion region of a second conductivity type formed within said well region and said first diffusion region of one of said plurality of diodes is connected to said second diffusion region of another diode,
   wherein said plurality of diodes collectively form an electrostatic discharge protective circuit,
   wherein a connection terminal leading from the first diffusion region of a diode at one edge of said electrostatic discharge protective circuit is connected to an input terminal of an external signal and a connection terminal leading from the second diffusion region of a diode at another edge of said electrostatic discharge protective circuit is connected to the reference potential,
   wherein the diode at the one edge of said electrostatic discharge protective circuit connected to said input terminal, has a size larger than a size of any of the other diodes.

5. The semiconductor device according to claim 4, wherein said plurality of diodes are substantially equal to each other in voltage drop in a forward direction.

6. A semiconductor device, comprising:
   a plurality of diodes including a substrate of a first conductivity type biased to a reference potential, a well region of a second conductivity type formed in a surface region of said substrate, and a first diffusion region of the first conductivity type formed in a surface region of said well region;
   wherein said plurality of diodes has sizes of at least two kinds and are cascade-connected to each other,
   wherein each of said plurality of diodes further comprises a second diffusion region of a second conductivity type formed within said well region and said first diffusion region of one of said plurality of diodes is connected to said second diffusion region of another diode,
   wherein said plurality of diodes collectively form an electrostatic discharge protective circuit,
   wherein a connection terminal leading from the first diffusion region of a diode at one edge of said electrostatic discharge protective circuit is connected to an input terminal of an external signal and a connection terminal leading from the second diffusion region of a diode at another edge of said electrostatic discharge protective circuit is connected to the reference potential,
   wherein sizes of said plurality of diodes decrease from a side of said input terminal toward a side of said reference potential.

7. The semiconductor device according to claim 6, wherein said plurality of diodes are substantially equal to each other in voltage drop in a forward direction.

8. A semiconductor device, comprising:
   a plurality of diodes including a substrate of a first conductivity type biased to a reference potential, a well region of a second conductivity type formed in a surface region of said substrate, and a first diffusion region of the first conductivity type formed in a surface region of said well region;
   wherein said plurality of diodes has sizes of at least two kinds and are cascade-connected to each other,
   wherein each of said plurality of diodes further comprises a second diffusion region of a second conductivity type formed within said well region and said first diffusion region of one of said plurality of diodes is connected to said second diffusion region of another diode,
   wherein said plurality of diodes collectively form an electrostatic discharge protective circuit,
   wherein a connection terminal leading from the first diffusion region of a diode at one edge of said electrostatic discharge protective circuit is connected to an input terminal of an external signal and a connection terminal leading from the second diffusion region of a diode at another edge of said electrostatic discharge protective circuit is connected to the reference potential,
   wherein each of said plurality of diodes is formed of a plurality of diodes having the same size,
   wherein each of said plurality of diodes includes a unit diode of a certain size, and said plurality of diodes differ from each other in the number of said unit diodes included therein so as to be formed in desired sizes,
   wherein said plurality of diodes are substantially equal to each other in voltage drop in a forward direction.

9. A semiconductor device, comprising:

an electrostatic discharge protective circuit arranged between an input terminal and an internal circuit;

wherein:

said electrostatic discharge protective circuit is formed of a plurality of cascade-connected diodes;

said plurality of cascade-connected diodes have at least two kinds of different sizes; and each of said plurality of cascade-connected diodes comprises a substrate of a first conductivity type, said substrate being biased to a reference potential, a well region of a second conductivity type formed in a surface region of said substrate, and a first diffusion region of the first conductivity type formed in said well region, wherein the size of each of said plurality of cascade-connected diodes is defined by the peripheral length of said first diffusion region.

10. A semiconductor device, comprising:

an electrostatic discharge protective circuit arranged between an input terminal and an internal circuit;

wherein:

said electrostatic discharge protective circuit is formed of a plurality of cascade-connected diodes;

said plurality of cascade-connected diodes have at least two kinds of different sizes; and each of said plurality of cascade-connected diodes comprises a substrate of a first conductivity type, said substrate being biased to a reference potential, a well region of a second conductivity type formed in a surface region of said substrate, and a first diffusion region of the first conductivity type formed in said well region, wherein the size of each of said plurality of cascade-connected diodes is defined by the area of said first diffusion region.

11. A semiconductor device, comprising:

an electrostatic discharge protective circuit arranged between an input terminal and an internal circuit;

wherein:

said electrostatic discharge protective circuit is formed of a plurality of cascade-connected diodes;

said plurality of cascade-connected diodes have at least two kinds of different sizes; and each of said plurality of cascade-connected diodes comprises a substrate of a first conductivity type, said substrate being biased to a reference potential, a well region of a second conductivity type formed in a surface region of said substrate, and a first diffusion region of the first conductivity type formed in said well region, wherein a diode of said plurality of cascade-connected diodes forming said electrostatic discharge protective circuit, is positioned on a side of said input terminal, the diode having a size larger than a size of any of the other diodes.

12. The semiconductor device according to claim 11, wherein said plurality of cascade-connected diodes are substantially equal to each other in voltage drop in a forward direction.

13. The semiconductor device according to claim 11, wherein sizes of said plurality of cascade-connected diodes decrease from the side of said input terminal toward a side of said reference potential.

14. The semiconductor device according to claim 13, wherein said plurality of cascade-connected diodes are substantially equal to each other in voltage drop in a forward direction.

15. A semiconductor device, comprising:

an electrostatic discharge protective circuit arranged between an input terminal and an internal circuit;

wherein:

said electrostatic discharge protective circuit is formed of a plurality of cascade-connected diodes;

said plurality of cascade-connected diodes have at least two kinds of different sizes; and each of said plurality of cascade-connected diodes comprises a substrate of a first conductivity type, said substrate being biased to a reference potential, a well region of a second conductivity type formed in a surface region of said substrate, and a first diffusion region of the first conductivity type formed in said well region, wherein each of said plurality of cascade-connected diodes is formed of a plurality of diodes having the same size, wherein each of said plurality of cascade-connected diodes includes a unit diode of a certain size, and said plurality of cascade-connected diodes differ from each other in the number of said unit diodes included therein so as to be formed in desired sizes, wherein said plurality of cascade-connected diodes are substantially equal to each other in voltage drop in a forward direction.

* * * * *